United States Patent [19]

Golke et al.

[11] Patent Number: 4,761,571
[45] Date of Patent: Aug. 2, 1988

[54] MEMORY CIRCUIT ENCHANCEMENT TO STABLIZE THE SIGNAL LINES WITH ADDITIONAL CAPACITANCE

[75] Inventors: Keith W. Golke, Minneapolis; Robert L. Rabe, Maple Grove, both of Minn.

[73] Assignee: Honeywell Inc., Minneapolis, Minn.

[21] Appl. No.: 811,145

[22] Filed: Dec. 19, 1985

[51] Int. Cl.⁴ .................. G11C 11/24; G11C 11/40; G06F 1/00; H03K 19/003
[52] U.S. Cl. .................................. 307/468; 307/530; 365/202; 365/205; 365/208; 365/149
[58] Field of Search .............. 307/465, 468, 469, 270, 307/269, 279, 304, 571, 584, 450, 482, 578, 530; 365/104, 202, 203, 205, 208, 149

[56] References Cited

U.S. PATENT DOCUMENTS

| | | | |
|---|---|---|---|
| 4,031,522 | 6/1977 | Reed | 365/208 X |
| 4,207,616 | 6/1980 | Heeren | 307/468 X |
| 4,397,003 | 8/1983 | Wilson et al. | 365/205 |
| 4,476,547 | 10/1984 | Miyasaka | 365/208 X |
| 4,598,389 | 7/1986 | Duvvury et al. | 365/208 |
| 4,622,655 | 11/1986 | Suzuki | 365/208 X |

OTHER PUBLICATIONS

Ho et al., "Noise Cancellation with the Dummy Word Line", IBM Tech. Discl. Bull., vol. 14, No. 11, pp. 3351-3352, Apr. 1972.

Primary Examiner—Stanley D. Miller
Assistant Examiner—David R. Bertelson
Attorney, Agent, or Firm—William T. Udseth

[57] ABSTRACT

A memory system having voltage level circuit switching portions operated between signal lines stabilized by additional capacitance.

23 Claims, 2 Drawing Sheets

MEMORY CIRCUIT ENCHANCEMENT TO STABLIZE THE SIGNAL LINES WITH ADDITIONAL CAPACITANCE

The Government of the United States of America has rights in this invention pursuant to Contract No. DNA 001-83-C-0241, awarded by the Defense Nuclear Agency.

BACKGROUND OF THE INVENTION

The present invention relates to digital logic and memory circuits, and more particularly, to those circuits using true and complement signal lines on either side of a circuit portion and formed in a monolithic integrated circuit chip which is subject to charge generating disturbances.

Monolithic integrated circuit structural features have been shrinking rapidly in size in recent years. Along with this shrinkage, the electrical current and electrical charges formed and manipulated in integrated circuits based on these features have also been diminishing in value. As a result, charges generated by certain charge generating disturbances which, in larger feature integrated circuits, would not be a problem become sufficiently large to cause difficulties in smaller feature integrated circuits. In voltage level state switching circuits, such as logic circuits or memory circuits, which are constructed using such smaller integrated circuit structures, these disturbance charges can be sufficient to cause switching from an existing logic state to another at points in the circuit where such charge is generated. The proper operation of the circuit could therefore be disturbed resulting in erroneous logic signals. Typically, such disturbances are local to the region near the disturbance and are temporary; thus such a disturbance is often termed a single event upset. Also, though the disturbance cause may be temporary, the results of the disturbance may be stored and are subject to being propagated which may lead to longer term effects.

A typical source of such charge generating disturbances is particle radiation. Such particles impinging on a monolithic integrated circuit will have "interactions" with the semiconductor material lattic structure and electrons along its path through the integrated circuit semiconductor material resulting in raising the energy of the electrons involved into the conduction band and leaving corresponding holes in the valance band. Should such electron-hole pairs be generated sufficiently close to a semiconductor pn junction, the electrons and holes so situated are subject to being collected by the action of electric fields in the region resulting because of voltage applied to such junction and because of diffusion toward such junction. The structure of transistor devices in integrated circuits, and the method of operating both such devices and the circuits using them generally is such that only reverse-biased pn junctions need be considered to understand the effects of a radiation particle impinging thereabout.

In FIG. 1, a semiconductor material substrate, 10, of one conductivity type is shown having in it a diffusion or implantation forming a region, 11, of an opposite conductivity type. Should a radiation particle impinge on region 11 and pass on into remaining portions of substrate 10, electron-hole pairs will be generated along the track of the particle as a result of the "collisions" indicated above.

If substrate 10 is of p-type conductivity and region 11 is of n-type conductivity, a voltage applied to place region 11 positive with respect to remaining portions of substrate 10 leads to reverse-biasing the semiconductor pn junction, 12, therebetween. The electrons sufficiently energized by the radiation particle and the corresponding holes will be separated by the electric field near junction 12 with electrons being attracted to positive region 11 and holes attracted or repelled into remaining portions of substrate 10. This separation of electrons and holes, in effect, provides a temporary current flow from region 11 into remaining portions of substrate 10.

This current will be comprised of an immediate drift current component for electrons and holes immediately subject to such electric field. A further component of this current will be provided by those electrons and holes which subsequently, by diffusion, move to be within the influence of this electric field. Such a current flow would have the effect of tending to discharge region 11 and so reduce the voltage of region 11 with respect to region 10, and to discharge the parasitic capacitances unavoidably present across junction 12.

If the conductivity types of region 11 and substrate 10 were reversed, the voltage polarity would also have to be reversed to provide reverse-bias to junction 12. Upon a similar radiation particle impact, the same collection process would occur but region 11, rather than tending to be discharged by arriving electrons, would now tend to be charged by arriving holes and to increase in voltage with respect to substrate 10. However, in either situation, the charge generated by an impinging radiation particle would act in a manner to tend to reduce the reverse-bias voltage across pn junction 12.

Metal-oxide-semiconductor field-effect transistor (MOSFET) circuits using only n-channel field-effect transistors will have only regions such as 11 of only n-type conductivity formed in a p-type conductivity substrate. In these circumstances, an impinging radiation particle will generate charge resulting in electrons being attracted to the implanted or diffused regions serving as the sources and drains of the n-channel transistors. This charge, as stated above, tends to reduce the reverse bias voltage on the associated pn junction.

In those MOSFET circuits using only p-channel field-effect transistors, the implanted or diffused regions will be all of p-type conductivity formed in an n-type conductivity substrate and will tend to increase in voltage as holes are attracted thereto as a result of the impingement of a radiation particle. MOSFET circuits of the complementary symmetry type (CMOS) requires further consideration as such circuits use both n-channel and p-channel field-effect transistors.

Such consideration can be made by looking further at FIG. 1 where a well region, 13, is shown formed in substrate 10 having a further implanted or diffused region, 14, formed therein. Well region 13 is separated from substrate 10 by a semiconductor pn junction, 15, and region 14 is separated from well region 13 by further semiconductor pn junction, 16. If an n-well CMOS arrangement is contemplated, then well region 13 is of n-type conductivity as would region 11 be. Substrate 10 would then be of p-type conductivity as would region 14.

Regions 11 and 14 are then typical of the kinds of regions used as sources and drains in constructing n-channel and p-channel field-effect transistors in an n-well CMOS integrated circuit. In such a circuit, junctions 12, 15, and 16 will all be reverse-biased in operation. This means that region 11 could be held positive with respect to substrate 10 as would region 13. Region 13 would also be held positive with respect to region 14.

A radiation particle impinging on region 11 and continuing on into substrate 10 would still yield the same results as described above. That is, electrons generated by the impinging particle would be attracted to region 11, and would be attracted from some distance into substrate 10 perhaps on the order of 7 μm in a current advanced fabrication process and less in smaller structure fabrication processes of the future. This would again tend to discharge region 11 and to reduce the reverse-bias voltage on junction 12.

A radiation particle impinging on region 14 and continuing on through region 13 into substrate 10 would, on the other hand, lead to much less charging of region 14 by holes on a comparable basis. The holes generated in region 13 by the radiation particle will split into two categories with those sufficiently near junction 16 being attracted to region 14, but with those sufficiently near junction 15 being attracted to substrate 10. As a result, region 14 will only attract holes which are within 1 to 2 μm of junction 16 in well region 13. (This is true of current advanced fabrication processes and is equal to approximately one-half the distance separating junctions 15 and 16.) Further, the lower mobility of holes in well region 13 will also diminish the number of them which are attracted to region 14.

As a result, for n-well CMOS monolithic integrated circuits, the charging of p-type conductivity sources and drains will be relatively insignificant. Instead, the discharging of the n-type conductivity source and drains of the n-channel field-effect transistors will be most significant in causing voltage changes sufficient to upset circuit operation. The p-type conductivity sources and drains of the p-channel field-effect transistors will attract charge from such a particle impinging thereon which in quantity will typically be an order of magnitude less than the charge attracted by the n-type conductivity sources and drains. Thus, any voltage changes on such p-type conductivity sources and drains (because of this attracted charge) will be smaller also by an order of magnitude. In p-well CMOS integrated circuits, on the other hand, the charge attracted to the p-type conductivity sources and drains resulting from an impinging radiation particle will be more dominant compared to the charge attracted to the n-type conductivity sources and drains.

A class of circuits which is subject to such upsets are those voltage level state switching circuits, i.e. logic circuits, or memory or other data circuits, which have a circuit portion connected between a pair of true and complement signal lines. In such a system, the circuit portion when activated, causes one of these lines to be in a selected voltage state while the other line is caused to be in the opposite voltage state. A common example of such a circuit is shown in FIG. 2A where there is depicted the internal cellular arrangement of a static random access memory arranged so that the memory cells in vertical sequence are connected between such true and complement signal lines to form a column, these being typically referred to as the true and complement bit lines. Other circuit types which are sometimes designed so that they are within this class of circuits are read-only-memory circuits, programmed logic arrays, communication buses and even dynamic random access memories.

Returning to the schematic diagram of the example static random access memory array of FIG. 2A, the array of memory cells, 20, is shown in boxes which are numbered in the interior to indicate which member of the cellular array the box represents. The boxes representing array cells 20 in practice each contain a memory cell circuit which, for a CMOS based array as will be described here, would be a circuit such as shown in FIG. 2C as will be described below.

Each cell 20 is shown having the left side thereof electrically connected to a true bit line, 21. Note that such bit lines are broken to indicate that not all the cells in a column served by such bit line are shown. On the right hand side of each such cell there is shown electrically connected the complement bit line, 22, also broken to indicate all cells are not being shown in the corresponding column.

The top end of each of bit line 21 and bit line 22 in each column is shown electrically connected to a bit line pair charging circuit or voltage level setting circuit, 23, often termed a "preset" circuit. This terminology is used since preset circuits 23 are used to set bit line voltage levels prior to interrogating a memory cell in the column to which such a circuit is connected to determine the state stored in such cell. In practice, the circuit of FIG. 2B is commonly used for each preset circuit 23 in this CMOS based example and is to be described below.

Static random access memories are operated with many different schemes for setting voltage levels on bit lines prior to memory cell interrogation, including setting bit line voltage levels to the lowest voltage level state, the highest voltage level state taken by the memory cells, or a voltage state halfway in between the highest and lowest voltage level states. The example chosen here is to set bit line 21 and 22 to the highest voltage level state prior to memory cell interrogation. The occurrence of such bit line voltage state setting is controlled by signals on preset control line, 24. The open circle shown at the top of the boxes 20 and 23, and at the top of the circuits in FIGS. 2B and 2C are intended to be connected to a positive voltage power supply.

At the other end of each column of cells associated with a pair of bit lines there is provided a sense amplifier, 25, which in practice is usually a differential amplifier. A true bit line 21 is shown electrically connected to the positive input of each amplifier 25 with a complement bit line 22 shown electrically connected to the negative input thereof.

There are many designs for sense amplifiers that are well known including ones useful in CMOS based integrated circuits such as is being described here as an example. Operation of a sense amplifier 25 as a differential amplifier and is based on providing at its output an amplified version of voltage differences occurring between its inputs but this version is limited in amplitude to being within limits of the output signal permissible values. The polarity of the difference will determine the relative polarity of the output signal. This is the basis for sensing the state of a memory cell which causes different voltage level states to occur on the bit lines 21 and 22 connected thereto when such cell is switched to permit an electrical path of relatively low impedance to occur between its interior circuitry and such bit lines.

One needed characteristic of sense amplifiers 25 is that the inputs must have a high impedance to permit preset circuits 23 to be able to set the voltage level state high of those bit lines 21 and 22 connected thereto prior to memory cell interrogation. This prevents the charge on the preset line parasitic capacitances from leaking away too quickly to thereby alter the voltage on these bit lines prior to or during the interrogation process. This is important because the bit line voltages during the interrogation process are intended to be affected only by memory cells connected thereto during interrogation.

Also shown in FIG. 2A are word lines, 26, otherwise termed as row enabling lines. Signals on lines 26 applied to each memory cell 20 electrically connected therealong in a row cause switching to occur in these memory cells permitting circuits interior to them to each have a low impedance electrical connection to the bit lines 21 and 22 connected thereto. This connection permits both altering the cell data content and the interrogating of the cell to ascertain what the current data content is. Lines 26 again are shown broken to indicate that not all of the columns used in the memory array are shown in FIG. 2A.

The rest of the circuitry for a complete memory system has been omitted from FIG. 2A including such circuits as the row and column decoders, cell data content altering, and the input and output circuitry. Such omission is made because such circuitry is unnecessary to be discussed to understand the preset invention.

The operation of the circuit in FIG. 2A during a memory cell interrogation begins with present circuits 23 charging each bit line 21 and 22 connected thereto to the high voltage level state which is approximately the voltage level of the positive voltage power supply connected thereto. This charging occurs in response to a low voltage level logic state occurring on line 24. This signal is applied to the gates of two p-channel field-effect transistors, 27, shown in FIG. 2B. Such a low level signal causes each of transistors 27 to switch into the "on" condition in effect connecting the positive voltage power supply, connected to the sources of these transistors, a bit lines 21 and 22 connected to the drains thereof. Bit lines 21 and 22 are thereby brought to what is typically the highest voltage level logic state used in the memory system. These bit lines will essentially remain at that voltage, maintained by the charge on the parasitic capacitances associated with each bit line, until altered by subsequent switching events affecting the bit lines.

Following such presetting of the bit lines, which is ended by returning line 24 to a high voltage level logic state, a high voltage level logic state will be provided to a selected one of row lines 26. This signal on a line 26 permits each of the n-channel field-effect transistors, 28, of FIG. 2C in each memory cell 20 to be in the "on" condition to permit a CMOS flip-flop circuit provided between these transistors to have a low impedance path to bit lines 21 and 22 in each of cells 20 connected along the selected word line.

The flip-flop connected between transistors 28 in FIG. 2C is comprised of two n-channel field-effect transistors, 29, and two p-channel field-effect transistors, 30. One of transistors 29 and one of transistor 30 on the left in the schematic diagram form a CMOS inverter, and the remaining ones of transistors 29 and 30 on the right form another CMOS inverter. These two inverters are cross connected between the outputs at the common source and drain connection and the inputs at the commonly connected gates to form a flip-flop well known in the art. This flip-flop will always have one output having a voltage value near that of the power supply positive voltage and so in a high voltage level state, and the other output having a voltage value near ground and so in the low voltage level state. Thus, having one side of the flip-flop in a high voltage level state and the other side being in a low voltage level state will be taken to denote a "one" being stored in the cell, and the opposite condition will be taken to represent the storage of a "zero" in the cell.

One transmission gate transistors 28 are permitted to be in the "on" condition, one side or the other of every memory cell along a word line 26 will be in the low voltage state and will act to discharge from the preset voltage level the bit line connected thereto. The other side will be in the high voltage level state and will not affect the voltage level of the bit line connected thereto. As a result, sense amplifier 25 in each column will sense the difference in bit line voltages or states for that column caused by that memory cell 20 of the column which has been enabled by a selected word line 26 and provide an output accordingly. The next cell interrogation cycle can thereafter be prepared for by bringing the selected word line 26 back to the low logic state condition and again presetting the bit lines to a high voltage level state.

In the arrangement of FIGS. 2A and 2C, each bit line will be formed depending on integrated circuit construction choice essentially either by (i) a single $n^+$-region serving as the outer connecting region (either source or drain) of each of transistors 28 on one side of each of the memory cells in FIG. 2A, or (ii) each bit line will be formed by a series of $n^+$-conductivity regions each serving as the outer connecting region (either source or drain) of one of transistors 28 along one side of each memory cell with these regions being otherwise electrically interconnected. Small exceptions occur because of a $p^+$-conductivity drain region of one of transistors 27 being connected to each bit line, and possibly because of a transistor region connected thereto in a sense amp 25. This essentially $n^+$-conductivity type region structure for bit lines is true because, as indicated above, transistors 28 are n-channel field-effect transistors.

This bit line structure, with the flip-flop circuit between transistors 28 as shown in FIG. 2C having n-channel transistors connected to ground, leads to having bit lines discharged only through n-channel field-effect transistors, and so only through $n^+$-conductivity regions, to ground. Such a design is typical and is desirable in that it minimizes the number of p-channel transistor interconnections made to the bit line which reduces the number of structures associated with the bit line and so the associated capacitance thereby promoting switching rapidity. Because of the higher mobility of electrons in n-channel field-effect transistors, such transistors can discharge bit lines faster than could p-channel field-effect transistors and so the choice of n-channel transistors here also promotes rapidity of switching.

However, bit lines 21 and 22, made up of one of a series of interconnected $n^+$-conductivity regions of the kind designated 11 in FIG. 1, are subject to a charge generating disturbances such as impingement of a radiation particle. Such a disturbance leads to a decrease in voltage on the disturbed bit line. If such a decrease in voltage occurred in connection with a memory cell interrogation operation, such decrease could be sensed by a sense amp, even though not caused by a memory cell discharge of the bit line, and leads to an erroneous output—a single event upset. An impact of a heavy ion such as Krypton having a not atypical energy of 70 million electron volts could generate as much as 3 picocoulombs of negative charge in the vicinity of a bit line in a typical 1.5 μm n-well CMOS technology. A typical bit line capacitance of 1.5 picofarads collecting that much charge would lead to a discharge that would lower the bit line voltage by two volts, an amount easily detected by a sense amplifier. As indicated above, only voltage decrease on the bit line will be significant because charge which might cause a voltage increase that is generated due to a radiation particle impinging in the vicinity of a p+-conductivity region in an n-well will lead to an order of magnitude less charge being collected in the region. The chances of such an occurrence are much less also because of the very small number of p-channel field-effect transistors and their p+-conductivity regions being connect to the bit line.

These possible and unwanted decreases in voltage on bit lines occurring because of a charge generating disturbance near any of them, such as due to impingement of a radiation particle could be reduced if bit line capacitance was directly increased or if sense amplifier sensitivity to voltage changes were reduced. However, either of these measures would also degrade the rapidity of switching permitting in the memory array and so increase the time taken to perform a memory cell interrogation operation. Such a result makes these measures unattractive.

A further possibility would be to resort to p-well technology so that the n-channel field-effect transistors would be built in a p-well and thereby gain the benefit of reduced charge collection that would occur because of charge splitting as described in connection with regions 13 and 14 of FIG. 1. However, disturbances at the p+-conductivity regions connected to bit lines 21 and 22 would then be more significant as there would be no longer any charge splitting at such regions to reduce the charge accumulated thereon, and the solution to the foregoing single event upset problem described below would also be of less benefit.

SUMMARY OF THE INVENTION

The present invention provides an improvement to circuits of the class having voltage level switching circuit portions operating between signal lines, where such portions are intended to cause the lines to take different voltage level states during interrogation by adding stabilizing capacitance through diodes to such lines.

DESCRIPTION OF THE PREFERRED EMBODIMENT

Figure 1:
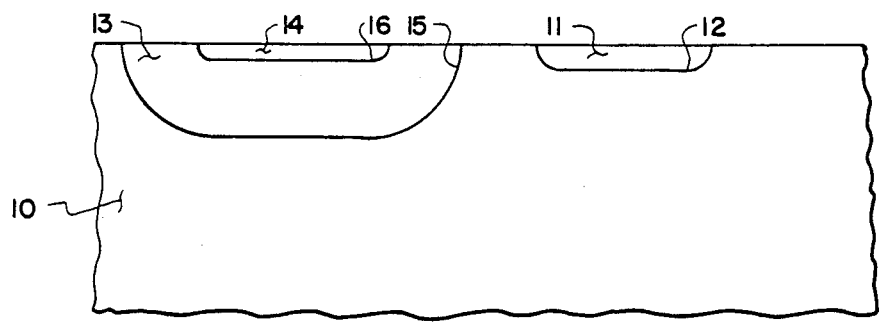
FIG. 1 shows a diagram of some varying conductivity type regions in semiconductor material leading to semiconductor pn junctions occurring.
Figure 2A:
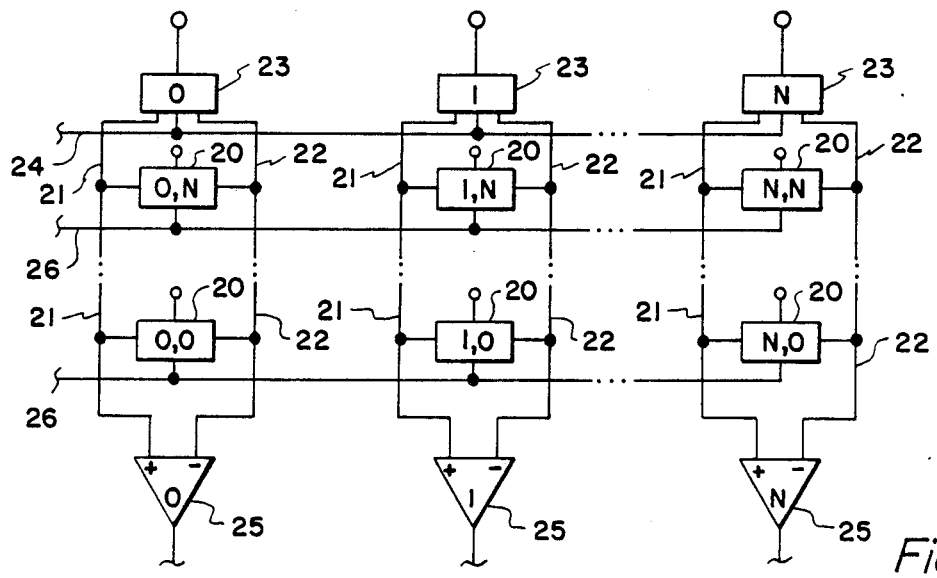
FIGS. 2A, 2B and 2C are schematic diagrams of known parts of a system and known circuits or circuit portions.
Figure 3:
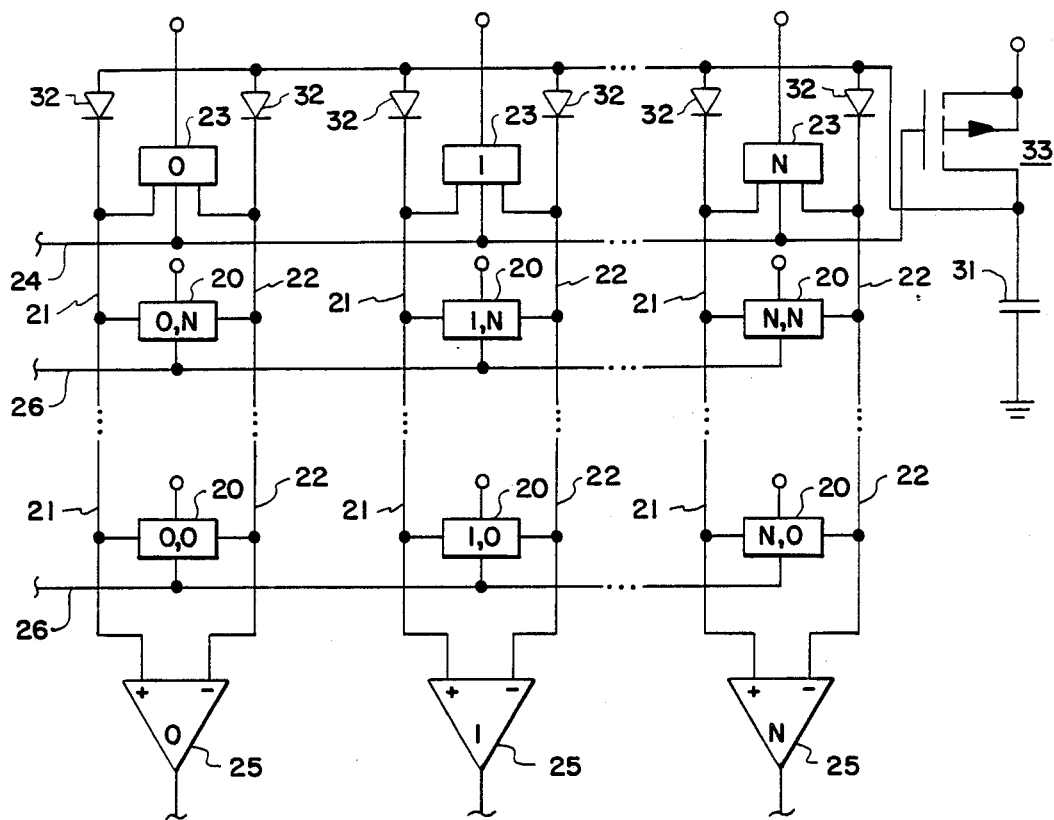
FIG. 3 is a schematic diagram of a portion of a system including the present invention.

The schematic diagram of the circuit or system shown in FIG. 3 repeats that shown in FIG. 2A but with additions including a stabilizing capacitance, 31. This capacitance is electrically connected at one side thereof to each of the bit lines 21 and 22 in each of the memory cell columns by the addition of diodes, 32. The diode anodes are directed toward capacitance 31, and the cathodes toward the bit lines. The charging of capacitance 31 is controlled by adding a p-channel field-effect transistor, 33, with its source electrically connected to the positive power supply and its drain electrically connected to the same side of capacitor 31 as is each of diodes 32. Transistor 33, in being controlled at its gate by preset control signals on line 24, can be switched into the "on" condition to essentially connect the positive power supply voltage to stabilizing capacitor 31. The other side of stabilizing capacitor 31 is shown electrically connected to ground, but could be connected to some other fixed voltage supply (or both if capacitance 31 is a distributed or multicomponent capacitance).

Figure 2B:
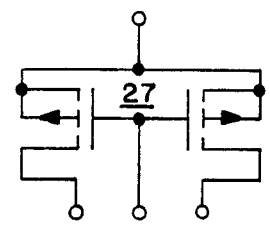
Figure 2C:
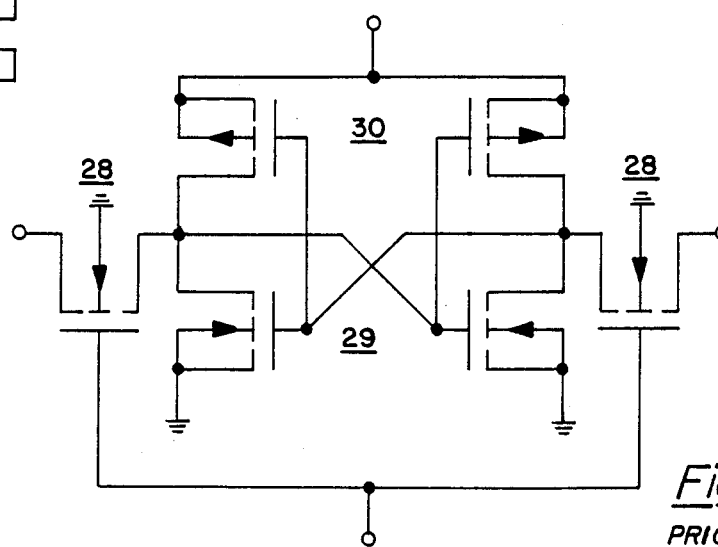

Again, a CMOS based example will be used in connection with FIG. 3 including the use of the circuits shown in FIGS. 2B and 2C. However, alternative MOS implementations are possible such as an n-channel field-effect transistor only MOS integrated circuit (NMOS). A p-channel transistor only MOS circuit (PMOS) version is also possible.

The example will again be based on use of precharging of the bit lines 21 and 22 to a high voltage state as described in connection with FIG. 2A. Other systems using bit lines initially in a low or intermediate voltage state can benefit from the present invention. In the first instance charge generating disturbances producing voltage increases will be significant, while in the second instance charge generating disturbances producing either a bit line voltage increase or decrease will be significant. The first instance would use diodes reversed in conducting direction, and the second could use pairs of diodes connected in opposite direction to a pair of capacitances. Appropriate charging voltages for the stabilizing capacitances would also be used. These alternative systems or the system of FIG. 2A could be implemented using other kinds of transistor devices in some circumstances such as by use of metal-semiconductor field-effect transistors (MESFETS) or by use of bipolar transistors.

Stabilizing capacitance 31 is chosen to have a relatively large capacitance value on the order of 5% of the total of all of the bit line parasitic capacitances in the memory array as implemented in a monolithic integrated circuit. This may be accomplished by merely choosing the structure for providing the electrical interconnection between transistor 33 and diodes 32 sufficiently large to yield such a parasitic capacitance values, or by adding other capacitances such as a plate or junction capacitance to provide such capacitance in a monolithic integrated circuit structure, or both. Diodes 32 as intended to be any kind of a rectifying, or single direction current conducting, element having a relatively low series equivalent resistance; such an element would typically be a junction diode or a Schottky diode.

In the circuit of FIG. 3, to perform a memory cell interrogation, there again would be provided a low voltage level logic state signal on line 24 to cause preset circuits 23 to charge bit lines 21 and 22 to approximately the positive power supply voltage. Such a signal will also cause transistor 33 to charge capacitance 31 to approximately the same positive power supply voltage.

After the signal on line 24 returns to the high voltage level logic state, a high voltage level logic state signal provided on a selected one of word lines 26 will permit each of memory cells 20 connected thereto to have each side of its internal flip-flop circuit electrically connected in a low resistance path through transistors 28 therein to corresponding bit lines 21 on the one side and 22 on the other. Since one of the other of true bit line 21 or complement bit line 22 in each column will then be discharged by the corresponding memory cell 20 activated by high logic state voltage on selected line 26, stabilizing capacitance 31 will also be discharged through diodes 32 by a bit line from each memory cell column through the activated memory cell therein discharging such bit line. That is, half of diodes 32 will be forward-biased because of a corresponding activated memory cell discharging the corresponding bit line connected thereto leading to the removal also of charge from stabilizing capacitor 31. The other half of diodes 32 will be reverse-biased because the corresponding bit lines connected thereto will not be discharged by a corresponding activated memory cell, and so these bit lines will stay at the preset voltage thereon while the voltage on stabilizing capacitor 31 voltage is dropping as just indicated.

In effect, stabilizing capacitance 31 will be effectively shared by each of these discharging bit lines, this effect adding on the order of 10% (5%/50%=10%) to the parasitic capacitance associated with each bit line along in FIG. 2A and causing a negligible increase in the time required to discharge such a bit line. This interrogation of memory cells 20 can again be terminated after reading the results on sense amps 25 by switching the high voltage level logic state to a low logic state on the selected one of word lines 26, and the memory system can be readied for another memory cell interrogation operation by again providing a low voltage level logic state on line 24 to preset the voltage on bit lines 21 and 22 and on stabilizing capacitance 31.

Consider now the occurrence of a charge generating disturbance near one of bit lines 21 or 22 because of a radiation particle impinging on one of the n+-type conductivity regions contained therein, or because of another source of negative charge for that region such as a nearby peripheral circuit in the memory system. As indicated above, the electrons resulting from such charge generation will collect in that n+-type conductivity region tending to cause the voltage on the bit line to decrease. The situation that is of interest is when the disturbance affects a bit line which is intended to remain in the preset high voltage level state, that is, a bit line which is not intended to be discharged by a memory cell 20. A disturbance affecting a bit line which is intended to be discharged by a memory cell 20 because of the state of the flip-flop wherein would merely reinforce that discharge without causing any harmful effect.

Where the disturbance affects a bit line intended to remain in the high voltage level state, three possibilities can occur depending on just when in the interrogation cycle such a disturbance occurs. The first possibility is that the disturbance on the bit line will occur between memory cell interrogations, that is, when there is a low logic state on line 24, so that preset circuits 23 are on, and a low logic state on all word lines 26 preventing any memory cell 20 activation. Then preset circuits 23 will restore the bit line which is affected to the high voltage level state it was in before the disturbance should the voltage level on it have dropped as a result of the disturbance. Because the flip-flop circuits in memory cells 20 are not permitted to have a low resistance path to the bit lines connected thereto, and because sense amps 25 will not be viewed as supplying valid data, no error will be observed by the rest of the system to have occurred at the output of any sense amp 25.

The next possibility is that the disturbance occurs in the interrogation operation after preset control line 24 is switched to the high logic state to end the charging of bit lines by preset circuits 23 but just before a high logic state occurs on a selected one of word lines 26. The disturbed bit line will then experience a voltage drop of no more than the forward voltage drop of that diode 32 connected thereto at which point stabilizing capacitance 31 would begin supplying current through that diode to, prevent the disturbed bit line from discharging further and so remain at that voltage value. (Of course, the voltage on that bit line will later reverse bias the diode 32 connected thereto as stabilizing capacitance 31 is discharged through half of the bit lines after activation.) Then, (i) after a high logic state subsequently occurs in the interrogation operation on a selected one of word lines 26, and (ii) for the time required for the now activated memory cell 20 connected to the disturbed bit line to discharge the other bit line connected thereto to a voltage value less than this diode forward voltage drop below the voltage or stabilizing capacitance 31, the output of the corresponding sense amp 25 as a differential amplifier would be an error. However, the time delay from memory cell activation to the point where the data at the output of the corresponding sense amplifier 25 would become correct because of such a sufficient discharge will be reduced by a factor of around three or more. This is because instead of having the disturbed bit line drop by something on the order of two volts as indicated above, the bit line voltage change will be no more than the forward voltage drop of the diode 32 connected thereto with respect to the other bit line connected to the memory cell, which forward drop would be in the vicinity of half a volt.

This delay could be shortened further if stabilizing capacitance 31 was charged to a voltage greater than that on preset bit lines, although in the circuit of FIG. 3 this would require a higher value positive voltage supply to transistor 33 compared to the positive voltage supply to preset circuits 23. This added supply could be avoided if the preset charging circuits 23 were eliminated entirely in the circuit of FIG. 3 with the bit line preset charging accomplished directly by transistor 33 through diodes 32.

The final possibility is that the disturbance occurs in the interrogation operation both after preset control line 24 has been switched to the high logic state, ending the charging of bit lines by preset circuits 23, and after a selected one of word lines 26 has been switched to a high logic state. In this instance, the half of the bit lines intended to be discharged by memory cells 20 activated along the selected word line 26, through having the flip-flops in them having low resistance paths established to the bit lines connected thereto, will have already discharged partially. The disturbed bit line will discharge sufficiently to reach a voltage level equal to the voltage level already occurring on the partially discharged bit line connected to the same memory cell, and on the other partially discharged bit lines, but no further before stabilizing capacitance 31 will supply current to hold the disturbed bit line from dropping in voltage below that on any of the other discharging bit lines.

Thereafter, as the other bit lines intended to be discharged continue to discharge they will reduce the voltage level on stabilizing capacitor 31 below the voltage on the disturbed bit line reverse-biasing that diode 32 connected to that line. The output of the sense amplifier 25 connected to the disturbed bit line will reflect an error for only the very short period of time from disturbance to the reverse-biasing of this diode, or possibly reflect no error at all if unable to sense the incorrect voltage differential in the short time that it occurs.

Thus, the additions shown in FIG. 3 to the memory system act to drastically shorten any time durations in which a bit line voltage level error, due to a charge generating disturbance on that bit line, reflected on the output of the corresponding sense amplifier 25. This markedly reduces the probability of an error occurring in data obtained from the memory system.

The additions shown in FIG. 3 to the memory system can also be used to perform other functions in the memory system. For instance, the voltage level on stabilizing capacitance 31 during memory cells 20 interrogation operations (i) decreases after the activating of the memory cells along a selected word line because of the subsequent discharging of this capacitance through the bit lines, (ii) increases after both the the ending of memory cell activation along the selected word line and the permitting again of both the preset circuits to charge the bit lines and transistor 33 to charge this capacitance, and (iii) stays more or less constant between such increases and decreases at the values reached by such increases and decreases. Therefore, the voltage level on stabilizing capacitance 31 can serve as a monitor to indicate the point at which a memory system is in an interrogation operation. The information from such monitoring could be used, as an example, to determine when to store the output of sense amps 25 as valid data that has been obtained at a point of adequate signal development on the bit lines. This information could also be used to determine when an adequate preset voltage obtained through the preset circuits charging the bit lines, has been reached on the bit lines.

As previously indicated, the additions to the memory circuits shown in FIG. 3 could also be used to eliminate the preset charging circuits 23 altogether. Alternatively, the additions could be used to assist preset devices 23 enabling the use of smaller transistors therein.

The embodiments of the invention in which an exclusive property or right is claimed are defined as follows:

1. An improvement for monolithic integrated circuits having a voltage level state switching circuit arrangement therein subject to an electrical charge generating disturbances where such voltage level states represent logic signals or data signals, said arrangement comprising at least in part a plurality of signal line pairs including first and second signal line pairs with each member line of said signal line pairs being capable of conducting electrical signals and with each of said first and second signal line pairs having at least one circuit portion electrically connected between its said member lines, including a first pair first circuit portion electrically connected between first signal line pair member lines and a second pair first circuit portion electrically connected between said second signal line pair member lines, such that either of said first and second circuit portions, upon receiving an access signal, can cause a selected one of said member lines connected thereto as aforesaid to be in a selected voltage level state and can cause said other member line connected thereto to be in a different voltage level state, said improvement in combination with the foregoing comprising:

a stabilizing capacitance electrically connected through a plurality of unidirectional current conducting means individually to member lines of said plurality of signal line pairs, including being electrically connected through a first unidirectional current conducting means to one of said member lines of said first signal pair and through a second unidirectional current conducting means to that remaining said member line of said first signal line pair, and again through a third unidirectional current conducting means to one of said member lines of said second signal line pair and through a fourth unidirectional current conducting means to that remaining said member line of said second signal line pair.

2. The improvement of claim 1 which further comprises a first charging means which can be directed to charge said stabilizing capacitance to a selected voltage level.

3. The improvement of claim 1 wherein said monolithic integrated circuit is a MOS field-effect transistor based integrated circuit having n-type conductivity regions serving at least in part as a portion of a said member line of each of said first and second signal line pairs.

4. The improvement of claim 2 which further comprises a second charging means in said integrated circuit which can be directed to charge said first and second signal line pairs member lines to a common voltage level state.

5. The improvement of claim 2 wherein said monolithic integrated circuit is a MOS field-effect transistor based integrated circuit having n-type conductivity regions serving at least in part as a portion of a said member line of each of said first and second signal line pairs.

6. The improvement of claim 3 wherein said unidirectional current conducting means are each a Schottky diode having its anode directed toward said stabilizing capacitance and its cathode directed toward a said member line of a said signal line pair.

7. The improvement of claim 3 wherein said unidirectional current conducting means are each a junction diode having its anode directing toward said stabilizing capacitance and its cathode directed toward a said member line and a said signal line pair.

8. The improvement of claim 4 wherein said monolithic integrated circuit is a MOS field-effect transistor based integrated circuit having n-type conductivity regions serving at least in part as a portion of a said member line of each of said first and second signal line pairs.

9. The improvement of claim 4 wherein said first and second charging means each have a control terminal means to receive directions to begin and end charging and which are electrically connected to one another.

10. The improvement of claim 4 wherein said unidirectional current conducting means are each a Schottky diode having its anode directed toward said stabilizing capacitance and its cathode directed toward a said member line of a said signal line pair.

11. The improvement of claim 4 wherein said unidirectional current conducting means are each a junction diode having its anode directing toward said stabilizing capacitance and its cathode directed toward a said member line of a said signal line pair.

12. The improvement of claim 5 wherein said unidirectional current conducting means are each a Schottky diode having its anode directing toward said stabilizing capacitance and its cathode directed toward a said member line of a said signal line pair.

13. The improvement of claim 5 wherein said unidirectional current conducting means are each a junction diode having its anode directing toward said stabilizing capacitance and its cathode directed toward a said member line of a said signal line pair.

14. The improvement of claim 6 wherein said MOS field-effect transistor based integrated circuit contains both n-channel and p-channel MOS field-effect transistors.

15. The improvement of claim 7 wherein said MOS field-effect transistor based integrated circuit contains both n-channel and p-channel MOS field-effect transistors.

16. The improvement of claim 8 wherein said unidirectional current conducting means are each a Schottky diode having its anode directing toward said stabilizing capacitance and its cathode directed toward a said member line of a said signal line pair.

17. The improvement of claim 8 wherein said unidirectional current conducting means are each a junction diode having its anode directing toward said stabilizing capacitance and its cathode directed toward a said member line of a said signal line pair.

18. The improvement of claim 10 wherein said MOS field-effect transistor based integrated circuit contains both n-channel and p-channel MOS field-effect transistors.

19. The improvement of claim 11 wherein said MOS field-effect transistor based integrated circuit contains both n-channel and p-channel MOS field effect transistors.

20. The improvement of claim 12 wherein said MOS field-effect transistor based integrated circuit contains both n-channel and p-channel MOS field-effect transistors.

21. The improvement of claim 13 wherein said MOS field-effect transistor based integrated circuit contains both n-channel and p-channel MOS field-effect transistors.

22. The improvement of claim 16 wherein said MOS field-effect transistor based integrated circuit contains both n-channel and p-channel MOS field-effect transistors.

23. The improvement of claim 17 wherein said MOS field-effect transistor based integrated circuit contains both n-channel and p-channel MOS field-effect transistors.

* * * * *